(12) United States Patent
Shi

(10) Patent No.: US 7,400,663 B2
(45) Date of Patent: Jul. 15, 2008

(54) ORIENTATED GROUP IV-VI SEMICONDUCTOR STRUCTURE, AND METHOD FOR MAKING AND USING THE SAME

(75) Inventor: Zhisheng Shi, Norman, OK (US)

(73) Assignee: The Board of Regents of the University of Oklahoma, Norman, OK (US)

( * ) Notice: Subject to any disclaimer, the term of this patent is extended or adjusted under 35 U.S.C. 154(b) by 36 days.

(21) Appl. No.: 11/051,826

(22) Filed: Feb. 4, 2005

(65) Prior Publication Data

US 2005/0199869 A1 Sep. 15, 2005

Related U.S. Application Data

(60) Provisional application No. 60/542,023, filed on Feb. 5, 2004.

(51) Int. Cl.
*H01S 5/00* (2006.01)
(52) U.S. Cl. ............... 372/43.01; 372/45.01; 372/46.01
(58) Field of Classification Search ............... 372/43.01
See application file for complete search history.

(56) References Cited

U.S. PATENT DOCUMENTS

| 4,542,512 A | | 9/1985 | Van Den Beemt | |
| 4,633,477 A | * | 12/1986 | Morrison et al. | 372/46.01 |
| 5,834,331 A | * | 11/1998 | Razeghi | 438/40 |
| 2002/0119680 A1 | | 8/2002 | Wang et al. | |
| 2002/0175324 A1 | * | 11/2002 | Razeghi | 257/14 |
| 2007/0071062 A1 | * | 3/2007 | Eisler et al. | 372/102 |

* cited by examiner

*Primary Examiner*—Dung T Nguyen
(74) *Attorney, Agent, or Firm*—Dunlap, Codding & Rogers, P.C.

(57) ABSTRACT

A method of growing and fabricating a group IV-VI semiconductor structure, for use in fabricating devices. In one embodiment, the group IV-VI semiconductor structure produced by the method of the present invention includes a group IV-VI material grown on a selected orientation of [110]. The devices fabricated can be a laser, detector, solar cell, thermal electrical cooling devices, etc. A laser device produced according to the present method will have a low threshold due to the lift-off of the energy degeneracy and low defect density. Growth on the [110] orientation also allows epitaxial growth of the semiconductor structure on a dissimilar substrate, which could improve the thermal dissipation and thus increase the operating temperature of the laser device.

21 Claims, 2 Drawing Sheets

ORIENTATED GROUP IV-VI SEMICONDUCTOR STRUCTURE, AND METHOD FOR MAKING AND USING THE SAME

CROSS-REFERENCE TO RELATED APPLICATIONS

The present application claims priority to the provisional patent application identified by the U.S. Ser. No. 60/542,023, which was filed on Feb. 5, 2004, the entire content of which is hereby expressly incorporated herein by reference.

STATEMENT REGARDING FEDERALLY SPONSORED RESEARCH OR DEVELOPMENT

Research regarding one or more portions of the present invention may have been funded pursuant to DOD ARO Grant Number DAAD19-03-1-0313.

BACKGROUND OF THE INVENTION

IV-VI lead salt semiconductors have wide spread applications for devices such as mid-infrared lasers, detectors and thermal electrical cooling devices. Previously, these devices have been fabricated using either [100] or [111] substrates such as [100] IV-VI substrates, [111] $BaF_2$ substrates and [111] Si substrates. Efforts have also been made to fabricate devices on III-V GaAs, GaSb substrates and II-VI CdTe, CdSe substrates.

In the area of lasers, much of the interest of recent worldwide explosion of mid-infrared (IR) laser diode research derives from the prospects for ultra-high-sensitivity chemical detection. The absorption spectra of trace gases are rich with features indicative of the molecular bonds present in the species. Large libraries of these spectra exist today which can be used for identifying unknown substances. For this reason, optical absorption spectroscopy has for decades been used in the identification of unknown substances by matching their distinct spectral absorption bands to the known library of spectra through a variety of "spectral fingerprinting" techniques.

The wide range of IR gas sensing applications includes pollution monitoring, detection of contraband (including chemical weapons, explosives, and drugs), toxic gas and chemical warning systems for buildings or military units, factory process control, automobile exhaust testing, and on-board exhaust analyzers, for example. Such gas sensing applications can be used to minimize vehicle pollution, perform safety and emissions monitoring for offshore, petrochemical and processing industries, and effectuate remote or personal-explosive hazard alarms.

Desired performance requirements of laser devices that are not currently available include tunable continuous wave (CW) operation at TE cooler temperature, spectral purity, and high output powers with good beam quality.

Currently, quantum cascade (QC) lasers, GaSb-based type II quantum well (QW) lasers, and IV-VI lead salts diode lasers are the leading approaches being pursued to meet gas sensing application needs. In the past decade, both QC and type II QW lasers have been proven successful. For example, optically pumped type II W-structure QW lasers have obtained continuous wave (CW) operation at 290 K using diamond-pressure-bond techniques. Up to the present, QC lasers have operated in CW mode above room temperature.

Among narrow gap semiconductors, IV-VI materials such as PbSe suppress Auger non-radiative loss (by more than an order of magnitude over the best III-V quantum wells), and have much lighter electron and hole masses that lead to further reduction of lasing thresholds. Previously, IV-VI materials have enabled lead salt lasers to set and maintain the records for maximum operating temperatures for both pulsed and CW operation among all mid-IR semiconductor diodes. They also provide advantages of easy current tuning, narrow linewidth, reproducibility and low cost.

For a number of years, lead salt diodes on [100] orientated substrates have been the only commercially available semiconductor mid-IR. However, their performance remains far from that desired because of their low operating temperatures and low efficiencies (single-mode output powers are typically $\leq 1$ mW, even at 77 K). There is also a tendency toward multi-mode operation and mode hopping. Lasing thresholds are significantly increased by the four-fold degeneracy of the L-valley conduction and valence band extrema. Quantum confinement does not lift the degeneracy in edge-emitting QW devices, since the four valleys remain symmetric for the [100] growth that must be employed to allow for the cleaving of laser cavities. This prevents the full exploitation of what is perhaps the greatest advantage of the IV-VI materials for high-temperature and long-wavelength operation, namely the threshold reduction that results from a low non-radiative recombination rate.

To solve some of the above-mentioned problems of IV-VI lasers, the inventor of the present invention proposed a IV-VI quantum well (QW) vertical cavity surface emitting laser (VCSEL) on a [111] orientated $BaF_2$ substrates, as reported in "Infrared Applications of Semiconductors III, Symposium," *Materials Research Society Symposium Proceedings*, Vol. 607, p. 181-84 (2000), the entire content of which is hereby expressly incorporated herein by reference. The VCSEL on a [111] orientated $BaF_2$ substrate significantly improved heat dissipation and had excellent beam quality with a circular and near-diffraction-limited single-mode. The degeneracy of the L valleys was lifted with growth on the [111] orientation, and threshold carrier concentration was reduced by up to a factor of four. Pulse laser emission at 4.6 μm was observed up to 290K. Key elements of the VCSEL on a [111] orientated $BaF_2$ substrate that contributed to its success included the $BaF_2$/PbSrSe broadband high-reflectivity distributed Bragg reflector (DBR), the improved epitaxial material quality on the [111] orientated substrate, and the lifted degeneracy of energy-bands by the [111] QW.

The lead salt VCSELs on [111] orientated $BaF_2$ substrates have progressed, and have obtained a 300 mW output power and a threshold density as low as 10.5 kW/cm. Above-room-temperature pulsed emission for a IV-VI material VCSEL on a [111] orientated $BaF_2$ substrate has also been obtained. Further, for [111] orientated IV-VI QW structures, peak output power with pulsed pumping have obtained an output power of 61 Watts at 180K, 17 Watts at 250K and 4.9 Watts at room temperature. However, while these previous VCSELs on [111] orientated $BaF_2$ substrates have proven successful in some aspects, the tuning and tuning range (as determined by cavity mode tuning) of these VCSELs have been limited. A key requirement for a laser used for optical absorption spectroscopy applications is the tunability of the center wavelength of the laser to appropriate resonances. Therefore, a need still exists for an agile continuous wave laser which is tunable over a broad portion of the IR spectrum.

While problems of material quality, efficiency, gain, etc., associated with various semiconductor structures have been generally described above with reference to laser devices, these same problems are also seen in semiconductor structures used in other electronic applications, including optoelectronic and thermoelectronic applications. Thus, there is a general need for a more efficient and effective semiconductor structure for electronic applications. It is to such a structure, and methods of making and using the same, that the present invention is directed.

SUMMARY OF THE PRESENT INVENTION

The present invention explores, for the first time, fabrication of devices using IV-VI lead salt materials on a [110] substrate. Theoretical and preliminary experimental results for the present invention show that [110] orientated IV-VI quantum well (QW) structures have much higher material gain than other orientations, such as [100] and [111] orientations, as discussed further in "[110] Orientated Lead Salt Mid-Infrared Lasers," *Applied Physics Letters*, 85, 2999 (2004), the entire content of which is hereby expressly incorporated herein by reference. In addition, the expected material quality of expitaxial layers on the [110] orientation is higher due to the easy dislocation gliding. Therefore, all devices using IV-VI materials orientated along the [110] direction will benefit. For example, fabrication of laser structures using [110] orientated IV-VI materials are given as examples of such devices herein. However, other devices such as detectors, thermal electrical cooling devices, solar cells, etc., can all be fabricated on a [110] orientation and therefore have improved performances.

In general, the present invention relates to a IV-VI semiconductor structure constructed of a group IV-VI material having a [110] orientation, and methods for making and using the same, so as to take advantage of the properties of IV-VI materials for device applications, such as for example laser, detector, thermal electrical cooling and solar cell applications.

The [110] orientated IV-VI semiconductor structure of the present invention provides high material quality, high modal gain, suppressed Auger non-radiative loss, light electron and hole masses, and lifts in degeneracy to reduce lasing threshold. A laser device utilizing the IV-VI semiconductor structure having a [110] orientation, which is constructed in accordance with the present invention, also has reproducibility over a broad range of wavelengths and can operate at continuous mode. Further, in one embodiment, a laser device can be provided with a ridge wave-guide structure with a thick gold plating to improve heat dissipation, thus obtaining a high continuous wave (CW) operating temperature, and single mode operation with a small ridge width.

One method of the present invention for making a IV-VI semiconductor structure having a [110] orientation includes cutting a bulk group IV-VI material. Another method of the present invention for making a IV-VI semiconductor material having a [110] orientation includes growing a narrow gap IV-VI material on [110] orientated substrates. The IV-VI material can be formed to include a single layer structure, a low dimensional structure such as quantum well (QW), a quantum wire and quantum dot structure, or combinations thereof. The substrates on which the IV-VI materials grow can be any [110] orientated substrates. These substrates can be [110] orientated IV-VI materials, fluorides such as $BaF_2$ and $CaF_2$, group IV materials such as Si, III-V materials such as GaSb and GaAs, or II-V materials such as CdTe and CdSe. For example, a PbSe/PbSrSe QW can be grown on a polished [110] BaF2 substrate using molecular beam epitaxy (MBE).

One method of the present invention for making a laser device which includes a group IV-VI semiconductor structure having a [110] orientation includes cleaving a [110] orientated group IV-VI material together with [110] oriented laser structures on top. Since IV-VI materials have (100) cleavage planes, the [110] oriented substrate provides two parallel (100) cleavage planes for laser cavity formation.

Other advantages and features of the present invention will become apparent to those skilled in the art when the following description is read in conjunction with the attached drawings and appended claims.

DETAILED DESCRIPTION OF THE INVENTION

Figure 1:
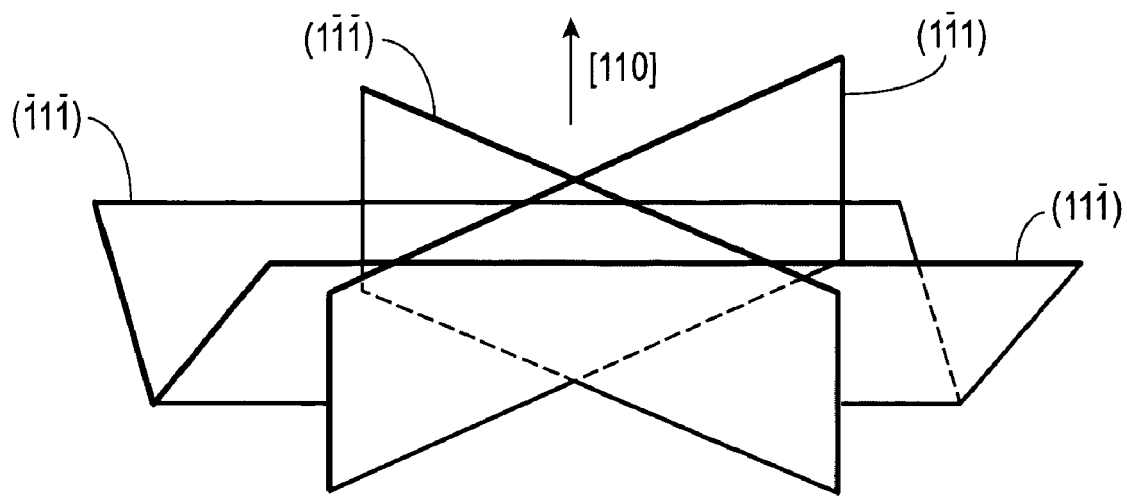
FIG. 1 is a schematic representation of the geometry of (110) surfaces in diamond cubic semiconductors with {111} planes shown.

Generally, the present invention relates to a IV-VI group semiconductor structure having a [110] orientation, and a method for making and using the same. The [110] orientation of the group IV-VI semiconductor structure of the present invention offers some advantages over other orientations. Shown in FIG. 1 is a schematic representation of the geometry of [110] surfaces in a diamond cubic semiconductor material with the {111} planes shown. For example, a IV-VI lead salt semiconductor material having a rock salt structure would belong to the diamond cubic group. Also, shown in Table 1 below is the effective mass for different orientations for the energy minima shown in FIG. 1. For PbSe, $m_l \approx 2m_t$.

TABLE 1

Effective masses along different orientations for L-valley energy minima

| Surface Orientation | $m_x$ | $m_y$ | $m_z$ | Degeneracy |
|---|---|---|---|---|
| {100} | | $\dfrac{m_t + 2m_l}{3}$ | $\dfrac{3m_t m_l}{m_t + 2m_l}$ | 4 |
| {110} | $m_t$ | $\dfrac{m_l + 2m_t}{3}$ | $\dfrac{3m_t m_l}{m_l + 2m_t}$ | 2 |
| | $m_t$ | $m_l$ | $m_l$ | 2 |
| {111} | $m_t$ | | $m_l$ | 1 |
| | $m_t$ | $\dfrac{m_t + 8m_l}{9}$ | $\dfrac{9m_t m_l}{m_t + 8m_l}$ | 3 |

The [110] orientation of the group IV-VI semiconductor structure of the present invention will partially lift off the degeneracy, while all four energy valleys in the [100] orientation will be degenerated. Although four [100] degenerated energy minima have higher density of states, the quasi Fermi energy levels of the two [110] valleys in a QW structure are higher than the [100] orientation at the same levels of carrier injection—which results in higher gain. In addition, growth of the [110] orientation generally has lower dislocation density because the mechanism of strain relaxation in IV-VI materials is by glide of dislocations and the Burgers vectors are of type a/2 <110>. Further, two parallel (100) cleaved facets of IV-VI materials can be formed on the [110] orientation.

Thus, in summary, the [110] orientation of the group IV-VI semiconductor structure of the present invention provides significant advantages such as high material quality, high modal gain, suppressed Auger non-radiative loss, light electron and hole masses, lifts in degeneracy, and the ready formation of Fabry-Perot cavities.

Figure 2:
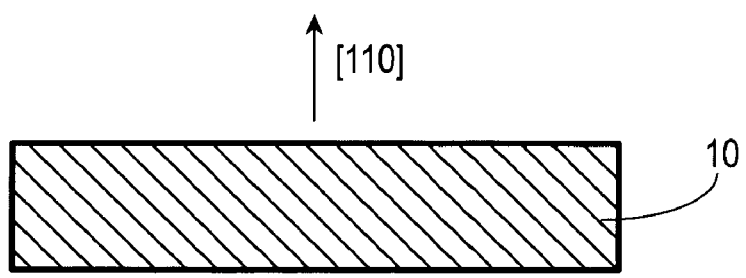
FIG. 2 is a cross-sectional view of one embodiment of a group IV-VI semiconductor structure constructed in accordance with the present invention.

Referring now to FIG. 2, shown therein is a group IV-VI semiconductor structure 10 having a [110] orientation, which is constructed in accordance with the present invention. The group IV-VI semiconductor structure 10 can be constructed utilizing any group IV-VI material, such as for example PbSe, PbTe, PbS, or their alloys with Sn, Sr, or Eu, or combinations thereof.

In one embodiment, the IV-VI group semiconductor structure 10 having a [110] orientation is formed by cutting a bulk group IV-VI material such that the cut surface of the bulk group IV-VI material has a [110] orientation. In another embodiment, the IV-VI group semiconductor structure 10 having a [110] orientation is formed by growing a layer of group IV-VI material on a [110] orientated substrate. For example, shown in FIG. 3 is a IV-VI group semiconductor structure (which is labeled therein by a reference numeral 10a for purposes of clarity) which is epitaxially grown on a substrate 14 having a [110] orientation such that the IV-VI group semiconductor structure 10a also has a [110] orientation.

In general, the substrate 14 has a growing surface 18 with a [110] orientation. In the fabrication sequence, a confinement layer or film of a group IV-VI material is allowed to grow on the growing surface 18 of the substrate 14. The orientation of the group IV-VI material will generally follow the orientation of the growing surface 18 of the substrate 14, thereby forming the group IV-VI semiconductor structure 10a having the [110] orientation. For example, the layer of group IV-VI material can be grown using epitaxial techniques such as molecular beam epitaxy (MBE), liquid phase epitaxy, hot wall epitaxy and metal organic chemical vapor deposition (MOCVD).

The substrate 14 can be constructed utilizing any material, or combination of materials, which will support the growth of the group IV-VI semiconductor structure 10a thereon and which has a [110] orientation. The substrate 14 can be constructed of a group IV-VI material, but can also be constructed of a material dissimilar to the material used to construct the group IV-VI semiconductor structure 10a. For example, the substrate 14 can be constructed of a [110] orientated IV-VI material such as PbSe or PbTe, a fluoride such as $BaF_2$ or $CaF_2$, a group IV material such as Si, a III-V material such as GaSb or GaAs, a II-V material such as CdTe or CdSe, or combinations thereof. In one preferred embodiment, the substrate 14 includes a layer of a fluoride material, such as for example $BaF_2$ or $CaF_2$ and/or a layer of a semiconductor material.

Figure 3:
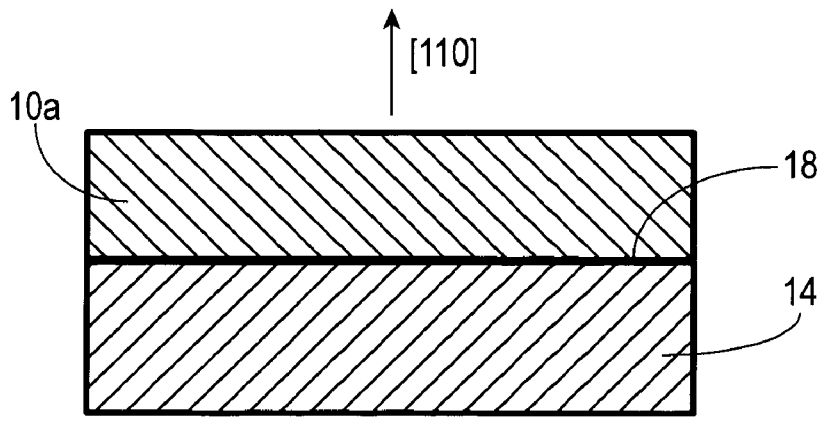
FIG. 3 is a cross-sectional view of another embodiment of a group IV-VI semiconductor structure constructed in accordance with the present invention.

As with the group IV-VI semiconductor structure 10 having a [110] orientation discussed above with reference to FIG. 2, the group IV-VI semiconductor structure 10a having a [110] orientation shown in FIG. 3 can be constructed utilizing any group IV-VI material, such as for example PbSe, PbTe, PbS, or their alloys with Sn, Sr, or Eu, or combinations thereof. Also, the group IV-VI semiconductor structure 10a can be formed to include a single layer structure, a quantum well structure, or combinations thereof. For example, a PbSe/PbSrSe QW can be grown on a polished [110] orientated $BaF_2$ substrate using molecular beam epitaxy (MBE) to form the group IV-VI semiconductor structure 10a.

The group IV-VI semiconductor structure having a [110] orientation of the present invention can be utilized in various semiconductor and electronic applications, including optoelectronic applications (such as lasers, detectors, solar cells, etc.) and thermoelectronic applications. For these various applications, techniques for fabricating electronic devices which are currently known in the art (e.g., etching, layer deposition, polishing, etc.), or those later developed, can be utilized to adapt the group IV-VI semiconductor structure having a [110] orientation for its intended purpose.

Figure 4:
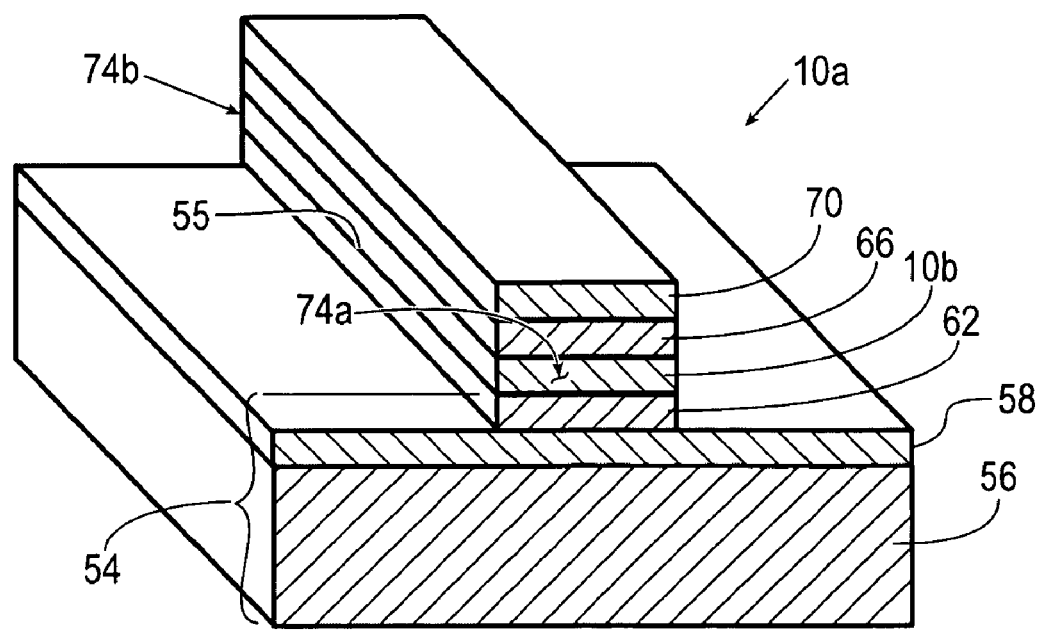
FIG. 4 is a perspective view of one embodiment of an edge-emitting laser device having a group IV-VI semiconductor structure having a [110] orientation, which is constructed in accordance with the present invention.

For example, shown in FIG. 4 is one embodiment of an edge-emitting laser device 50 which includes a group IV-VI semiconductor structure having a [110] orientation (which is labeled therein by a reference numeral 10b for purposes of clarity), which is constructed in accordance with the present invention. The group IV-VI semiconductor structure 10b is similar in construction as the group IV-VI semiconductor structure 10a discussed above with reference to FIG. 3 in that the group IV-VI semiconductor structure 10b is grown on a substrate (which is labeled in FIG. 4 by a reference numeral 54) which has a [110] orientated growing surface (which is labeled in FIG. 4 by a reference numeral 55). The substrate 54 can be a dissimilar material than the group IV-VI semiconductor structure 10b. Epitaxial growth of the group IV-VI semiconductor structure 10b on some dissimilar substrates improves thermal dissipation, and thus increases the operating temperature of the laser device 50.

The substrate 54 of the laser device 50 includes a base layer 56 which is preferably constructed of a fluoride material (e.g., $BaF_2$, $CaF_2$), or a semiconductor material (e.g., PbSe, PbTe, GaSb, GaAs, CdSe, CdTe, Si). When the edge-emitting laser device 50 is utilized in an electrically pumped application and the base layer 56 of the substrate 54 is constructed of a fluoride material, the substrate 54 also includes a bottom contact layer 58 constructed of a semiconductor material which is disposed on the fluoride base layer 54, as shown for example in FIG. 4. However, when the base layer 54 is constructed of a semiconductor material, the bottom contact layer 58 can be omitted The substrate 54 of the laser device 50 further includes a bottom electrical and optical confinement layer 62 disposed on the bottom contact layer 58 (or the base layer 54 when the bottom contact layer 58 is omitted). The bottom electrical and optical confinement layer 62 can be constructed of any material that IV-VI materials can be grown epitaxially on and that improves the efficiency with which electrical and/or optical energy is confined in the group IV-VI semiconductor structure 10b of the laser device 50. In other words, the bottom electrical and optical confinement layer 62 can be constructed of any material that substantially prevents the transmission of electrical and/or optical energy beyond the interface between the group IV-VI semiconductor structure 10b and the bottom electrical and optical confinement layer 62. In one preferred embodiment, when a PbSe-based material is used to construct the group IV-VI semiconductor structure 10b, the bottom electrical and optical confinement layer 62 is constructed of a PbSrSe material. However, the bottom electrical and optical confinement layer 62 can also be constructed of another material such as PbEuSe, PbSSe. Also, dissimilar materials such as GaSb, CdSe, etc., can also be used to construct the bottom electrical and optical confinement layer 62 as long as the material's quality is high enough. Also, the bottom electrical and optical confinement layer 62 can be either n- or p-type doped for an electrically pumped structure or undoped for an optically pumped structure. Further, the bottom electrical and optical confinement layer 62 of the substrate 54 provides the growing surface 55 of the substrate 54 on which the group IV-VI semiconductor structure 10b having a [110] orientation is disposed, as shown in FIG. 3.

The laser device 50 further includes a top electrical and optical confinement layer 66 disposed on the group IV-VI semiconductor structure 10b having a [110] orientation. The top electrical and optical confinement layer 66 is similar in construction as the bottom electrical and optical confinement layer 62 discussed above. For example, the top electrical and optical confinement layer 66 can be constructed of a PbSrSe material when a PbSe-based material is used to construct the group IV-VI semiconductor structure 10b. Also, the top electrical and optical confinement layer 66 can be either n- or p-type doped for an electrically pumped structure or undoped for an optically pumped structure. Generally, the doping of the top electrical and optical confinement layer 66 depends on the doping of the bottom electrical and optical confinement layer 62.

Further, when the edge-emitting laser device 50 is utilized in an electrically pumped application, a top contact layer 70 constructed of a metal material (e.g. gold) is disposed on the top electrical and optical confinement layer 66 to provide sufficient Ohmic contact.

The group IV-VI semiconductor structure 10b is cleaved so as to form parallel facets 74a and 74b which form a laser cavity and from which the laser emission of the laser device 50 is projected. The parallel facets 74a and 74b can be either two cleaved {100} facets (such as when the group IV-VI semiconductor structure 10b is grown on a substrate 54 constructed of a group IV-VI material such as PbSe, PbTe, etc.) or two parallel facets formed by other techniques such as etching, or distributed feed back structure for the cavity formation (such as when the group IV-VI semiconductor structure 10b is grown on a substrate 54 constructed of a fluoride material).

Figure 5:
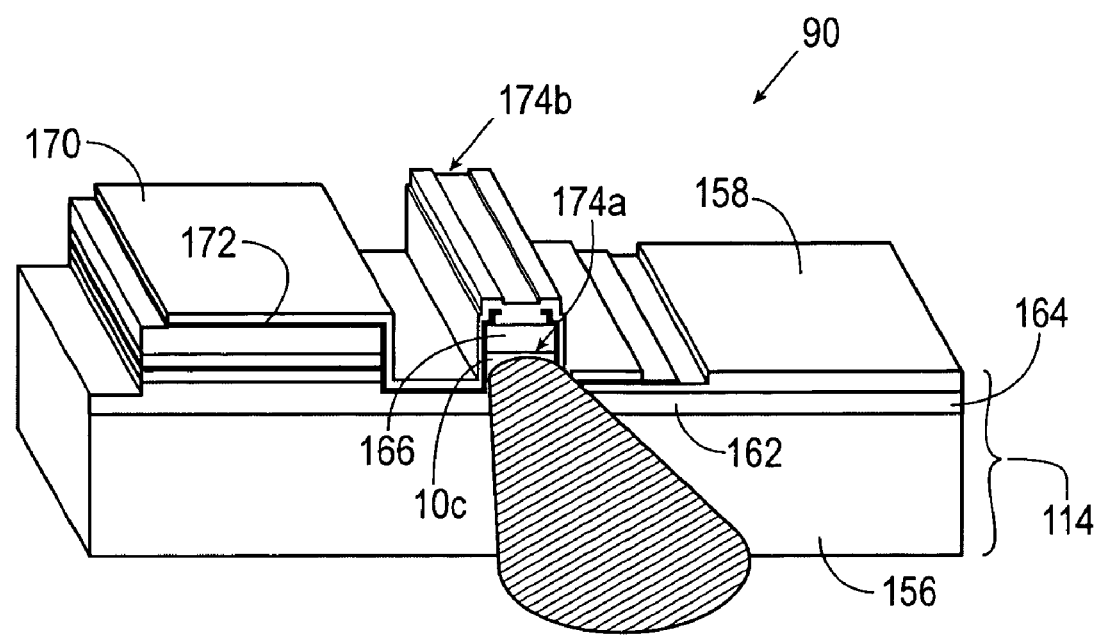
FIG. 5 is a perspective view of another embodiment of an edge-emitting laser device having a group IV-VI semiconductor structure having a [110] orientation, which is constructed in accordance with the present invention

Referring now to FIG. 5, shown therein in more detail is another example of a group IV-VI semiconductor structure having a [110] orientation being utilized in a laser application. Shown in FIG. 5 and labeled by the reference numeral 90 is an electrically injected, edge-emitting diode laser device constructed in accordance with the present invention. The laser device 90 is constructed to emit at mid-IR wavelengths, and operate at continuous mode and above thermal-electrically cooled temperatures. The laser device 90 includes a group IV-VI semiconductor structure having a [110] orientation, (which is labeled in FIG. 5 by a reference numeral 10c for purposes of clarity).

The group IV-VI semiconductor structure 10c having a [110] orientation is similar in construction as the group IV-VI semiconductor structure 10a and 10b discussed above with reference to FIGS. 3 and 4, respectively, in that the group IV-VI semiconductor structure 10c is also grown on a [110] orientated substrate (which is labeled in FIG. 5 by a reference numeral 114).

The group IV-VI semiconductor structure 10c having a [110] orientation is preferably constructed of a lead salt based material or a lead-alloy-chalcogenide, and includes at least one quantum well structure. For example, the group IV-VI semiconductor structure 10c having a [110] orientation can be constructed of PbSe/PbSrSe material, and having a multi quantum well (MQW) structure.

The substrate 114 includes a base layer 156, which is preferably constructed of a $BaF_2$ material. The substrate 114 also includes a bottom electrical and optical confinement layer 162, which is preferably constructed of an n-type PbSrSe material, and which is disposed on the base layer 156. Disposed on a portion of the bottom electrical and optical confinement layer 162, near a first end 164 of the bottom electrical and optical confinement layer 162, is a bottom contact layer 158. The bottom contact layer 158 is preferably constructed of p-type PbSrSe materials.

The group IV-VI semiconductor structure 10c having a [110] orientation is also disposed on the bottom electrical and optical confinement layer 162 of the substrate 114, near the bottom contact layer 158. The laser device 90 further includes a top electrical and optical confinement layer 166, which is preferably constructed of a p-type PbSrSe material, and which is disposed on the group IV-VI semiconductor structure 10c. Further, the laser device 90 includes a top contact layer 170, which is preferably constructed of an Au material, and which is disposed on the top electrical and optical confinement layer 166. To provide the top contact layer 170 with an appropriate surface area, the top contact layer 170 may also be disposed on a portion of the substrate 114, with an insulating material 172 disposed therebetween, as shown for example in FIG. 5. The insulating material 172 can be constructed of $BaF_2$, $Si_3N_4$, or $SiO_2$, for example.

In one embodiment, the substrate 114, the group IV-VI semiconductor structure 10c having a [110] orientation and the top electrical and optical confinement layer 166 form a ridge wave-guide structure, and the top contact layer 170 is a gold plating with a thickness in a range from about 1 µm to 6 µm, and preferably a thickness of about 3 µm, so as to improve heat dissipation, thus allowing the laser device 90 to obtain a high continuous wave (CW) operating temperature, and single mode operation with a small ridge width (generally less than 5-10 µm).

After the group IV-VI semiconductor structure 10c is grown on the substrate 114, a laser cavity consisting of facets 174a and 174b can be formed in the group IV-VI semiconductor structure 10c grown on the substrate 114 either by etching or by cleaving on {100} planes with the group IV-VI semiconductor structure 10c being removed from the substrate 114.

While the [110] orientated IV-VI semiconductor structure of the present invention has been described in some detail herein for use in edge-emitting laser devices by way of illustration and example for purposes of clarity of understanding, it should be understood that the [110] orientated IV-VI semiconductor structure can be used in other types of laser devices. Also, it should be understood that while the [110] orientated IV-VI semiconductor structure of the present invention has been described by way of illustration and example as being utilized in laser applications, it will be apparent to those skilled in the art that the [110] orientated IV-VI semiconductor of the present invention, and the methods described herein for forming the same, may also be utilized in other applications to form other devices, as mentioned above. Further, it will be apparent to those skilled in the art that certain changes and modifications may be practiced without departing from the spirit and scope of the invention, as described and claimed herein.

What is claimed is:
1. A laser device, comprising:
   a substrate having a growing surface with a [110] orientation; and
   a semiconductor structure having a [110] orientation comprising a group IV-VI material epitaxially grown on the growing surface of the substrate such that the orientation of the group IV-VI material substantially follows the [110] orientation of the growing surface of the substrate, wherein the substrate comprises:
    a base layer constructed of a fluoride material;
    a bottom contact layer constructed of a semiconductor material, the bottom contact layer being disposed on the base layer; and
    a bottom electrical and optical confinement layer disposed on the bottom contact layer, the bottom electrical optical confinement layer providing the growing surface on which the semiconductor structure having a [110] orientation is grown.

2. The laser device of claim 1, wherein the semiconductor structure having a [110] orientation includes a single layer structure.

3. The laser device of claim 1, wherein the group IV-VI structure having a [110] orientation includes a quantum well structure.

4. The laser device of claim 1, wherein the substrate comprises:
    a base layer constructed of a semiconductor material; and
    a bottom electrical and optical confinement layer disposed on the base layer, the bottom electrical optical confinement layer providing the growing surface on which the semiconductor structure having a [110] orientation is grown.

5. The laser device of claim 4, wherein the semiconductor material of the base layer of the substrate is a material selected from the group consisting of IV-VI materials, IV materials, III-V materials, and II-V materials.

6. The laser device of claim 4, wherein the bottom electrical and optical confinement layer is constructed of a PbSrSe material.

7. The laser device of claim 4, wherein the bottom electrical and optical confinement layer is n-type doped.

8. The laser device of claim 4, wherein the bottom electrical and optical confinement layer is p-type doped.

9. The laser device of claim 1, wherein the fluoride material of the base layer is a material selected from the group consisting of $BaF_2$ and $CaF_2$.

10. The laser device of claim 1, wherein the bottom contact layer is constructed of a semiconductor material selected from the group consisting of IV-VI materials, IV materials, III-V materials, and II-V materials.

11. The laser device of claim 1, wherein the bottom electrical and optical confinement layer is constructed of a PbSrSe material.

12. The laser device of claim 1, wherein the bottom electrical and optical confinement layer is n-type doped.

13. The laser device of claim 1, wherein the bottom electrical and optical confinement layer is p-type doped.

14. The laser device of claim 1, further comprising a top electrical and optical confinement layer disposed on the semiconductor structure having a [110] orientation.

15. The laser device of claim 14, wherein the top electrical and optical confinement layer is constructed of a PbSrSe material.

16. The laser device of claim 14, wherein the top electrical and optical confinement layer is n-type doped.

17. The laser device of claim 14, wherein the top electrical and optical confinement layer is p-type doped.

18. The laser device of claim 14, further comprising a top contact layer constructed of a metal material, the top contact layer being disposed on the top electrical and optical confinement layer.

19. The laser device of claim 1, wherein the semiconductor structure having a [110] orientation further comprises parallel facets.

20. The laser device of claim 19, wherein the parallel facets are two {100} cleaved facets.

21. The laser device of claim 19, wherein the parallel facets are two etched parallel facets.

* * * * *

UNITED STATES PATENT AND TRADEMARK OFFICE
CERTIFICATE OF CORRECTION

PATENT NO. : 7,400,663 B2  Page 1 of 1
APPLICATION NO. : 11/051826
DATED : July 15, 2008
INVENTOR(S) : Zhisheng Shi It is certified that error appears in the above-identified patent and that said Letters Patent is hereby corrected as shown below:

In the Specification:
Column 5, line 3: Delete "of" and replace with -- on --.
Column 5, line 31: Delete "10afor" and replace with -- 10a for --.
Column 6, line 25: Delete "10bis" and replace with -- 10b is --.

Signed and Sealed this

Twenty-first Day of October, 2008

JON W. DUDAS
*Director of the United States Patent and Trademark Office*